(12) United States Patent
Ingle

(10) Patent No.: US 10,418,419 B2
(45) Date of Patent: Sep. 17, 2019

(54) RADIATION-EMITTING APPARATUS HAVING AN OUTER OPTOELECTRONIC DEVICE SURROUNDING AN INNER OPTOELECTRONIC DEVICE AND METHODS FOR PRODUCING THE SAME

(71) Applicant: OSRAM OLED GmbH, Regensburg (DE)

(72) Inventor: Andrew Ingle, Allershausen (DE)

(73) Assignee: OSRAM OLED GMBH, Regensburg (DE)

( * ) Notice: Subject to any disclaimer, the term of this patent is extended or adjusted under 35 U.S.C. 154(b) by 77 days.

(21) Appl. No.: 15/509,153

(22) PCT Filed: Sep. 3, 2015

(86) PCT No.: PCT/EP2015/070166
§ 371 (c)(1),
(2) Date: Mar. 6, 2017

(87) PCT Pub. No.: WO2016/037925
PCT Pub. Date: Mar. 17, 2016

(65) Prior Publication Data
US 2017/0256592 A1   Sep. 7, 2017

(30) Foreign Application Priority Data
Sep. 8, 2014 (DE) .................. 10 2014 112 879

(51) Int. Cl.
*H01L 27/32* (2006.01)
*H01L 51/56* (2006.01)
*H01L 51/52* (2006.01)

(52) U.S. Cl.
CPC ...... *H01L 27/3202* (2013.01); *H01L 27/3239* (2013.01); *H01L 51/5203* (2013.01);
(Continued)

(58) Field of Classification Search
CPC ............ H01L 27/3202; H01L 27/3204; H01L 51/5203
See application file for complete search history.

(56) References Cited

U.S. PATENT DOCUMENTS

2004/0164667 A1* 8/2004 Dedene ............... H01L 27/3218
                                                  313/500
2011/0297996 A1* 12/2011 van den Brand ... H01L 27/3202
                                                  257/99
2014/0217377 A1   8/2014 Dussert-Vidalet et al.

FOREIGN PATENT DOCUMENTS

CN       102812577 A   12/2012
DE   WO 2012045857 A1 *  4/2012   ......... H01L 27/3202
(Continued)

OTHER PUBLICATIONS

First Office Action dated Dec. 27, 2018, issued against Chinese Patent Application No. 201580047805.4, including English translation (18 pages).

*Primary Examiner* — Anh D Mai
(74) *Attorney, Agent, or Firm* — McDermott Will & Emery LLP

(57) ABSTRACT

The invention relates to a radiation-emitting device (600), which comprises a substrate (100), an inner optoelectronic component (300) and an outer optoelectronic component (200) which at least partially laterally surrounds the inner optoelectronic component (300). Further, the radiation-emitting device (600) has a cover element (500) which is arranged on the optoelectronic components (200, 300) and comprises a first contact element (521), connected to a first electrode surface of the inner optoelectronic component (300) in an electrically conductive manner, and a second contact element (522) connected to a second electrode surface of the inner optoelectronic component (300) in an electrically conductive manner.

18 Claims, 7 Drawing Sheets

Figure 1:
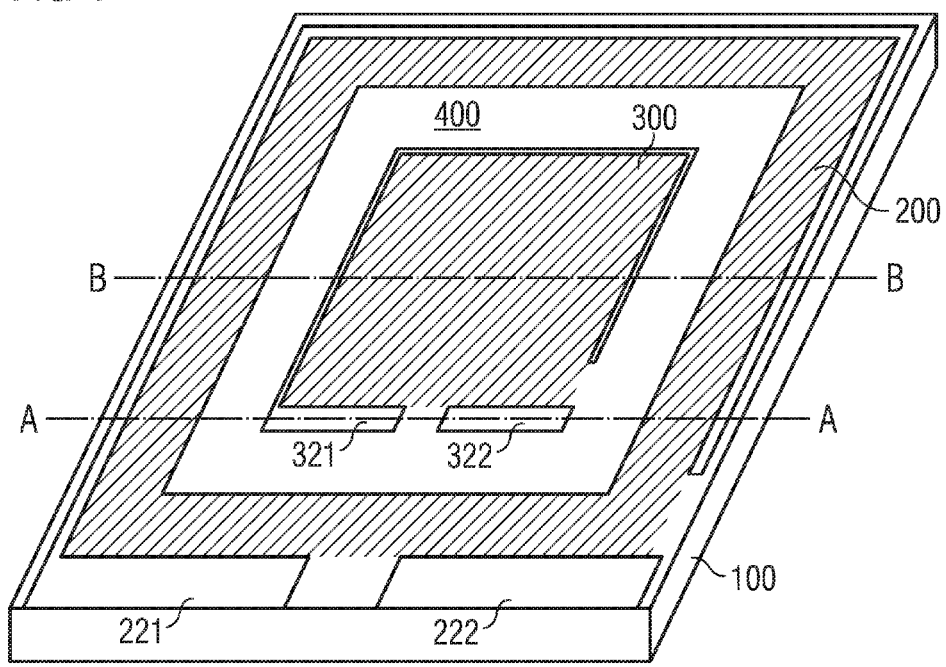

(52) U.S. Cl.
CPC .......... *H01L 51/5253* (2013.01); *H01L 51/56* (2013.01); *H01L 51/5246* (2013.01); *H01L 2251/5323* (2013.01); *H01L 2251/5361* (2013.01)

(56) References Cited

FOREIGN PATENT DOCUMENTS

| | | |
|---|---|---|
| DE | 102012223162 A1 | 6/2014 |
| DE | 112012004123 T5 | 7/2014 |
| DE | 102013107613 A1 | 1/2015 |
| EP | 2550693 A1 | 1/2013 |
| TW | 201212329 A | 3/2012 |
| WO | 2011117771 A1 | 9/2011 |
| WO | 2011161610 A2 | 12/2011 |
| WO | 2012049580 A1 | 4/2012 |
| WO | 2013061197 A1 | 5/2013 |
| WO | 2015032901 A2 | 3/2015 |

\* cited by examiner

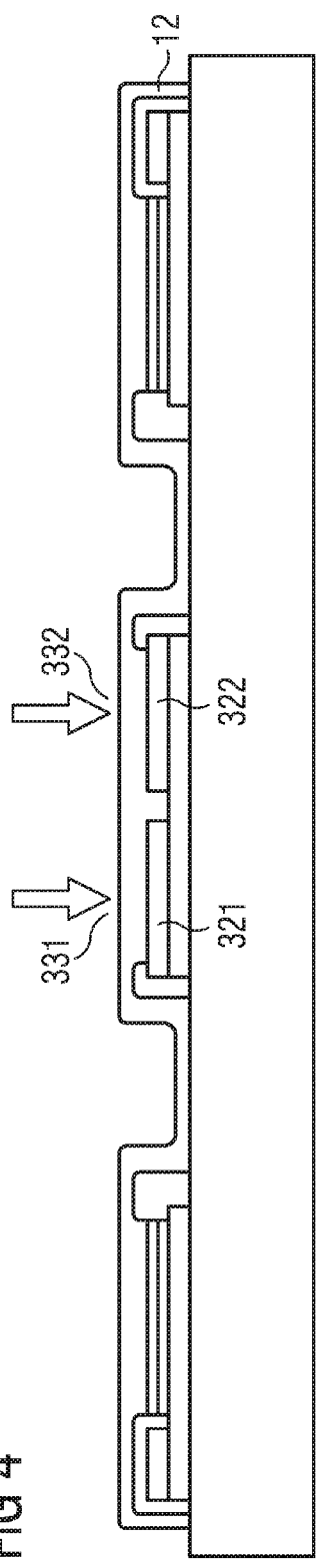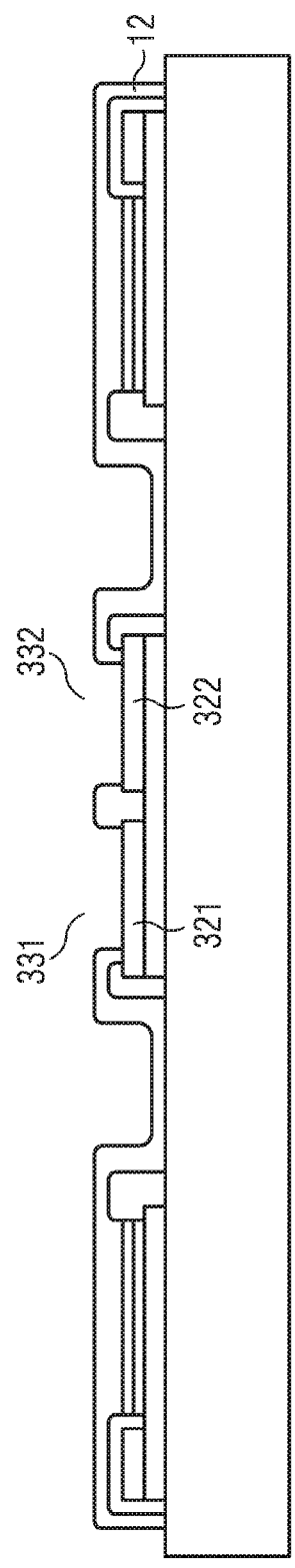

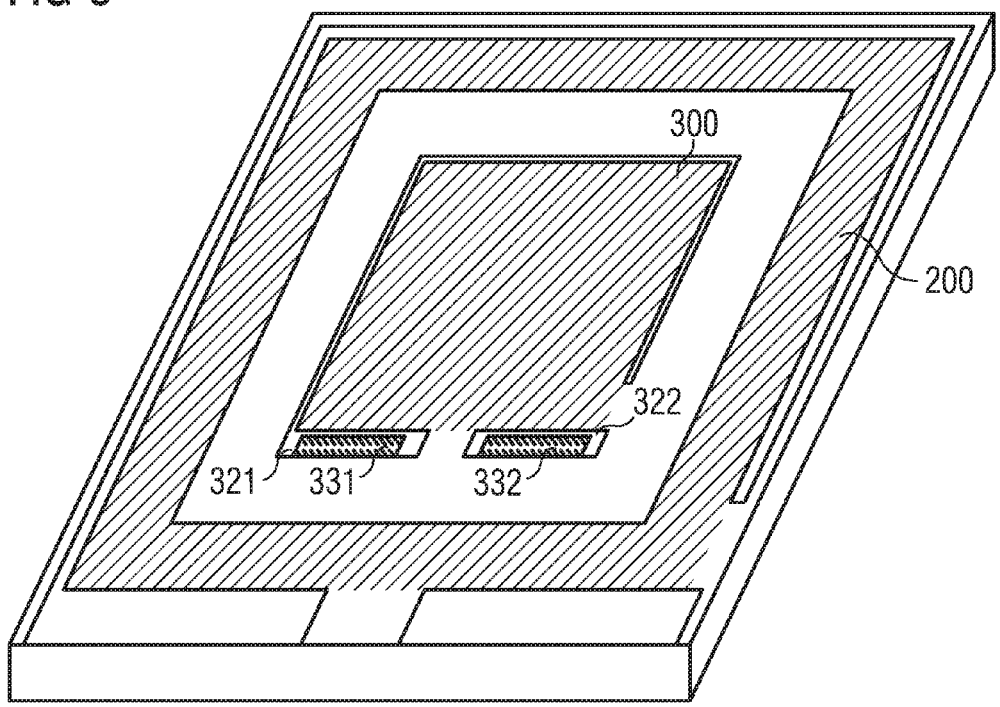

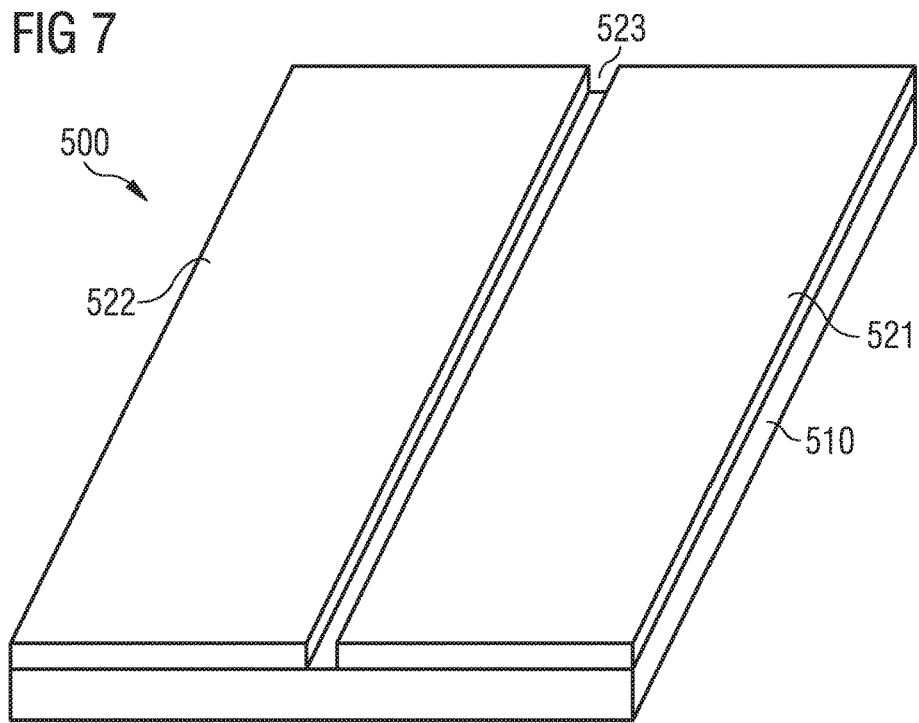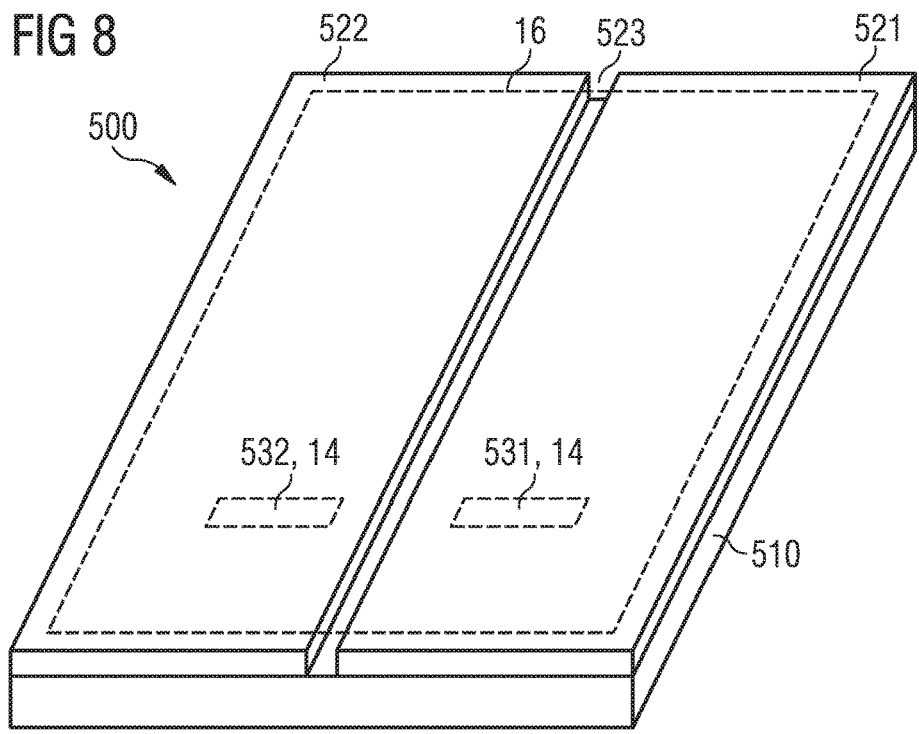

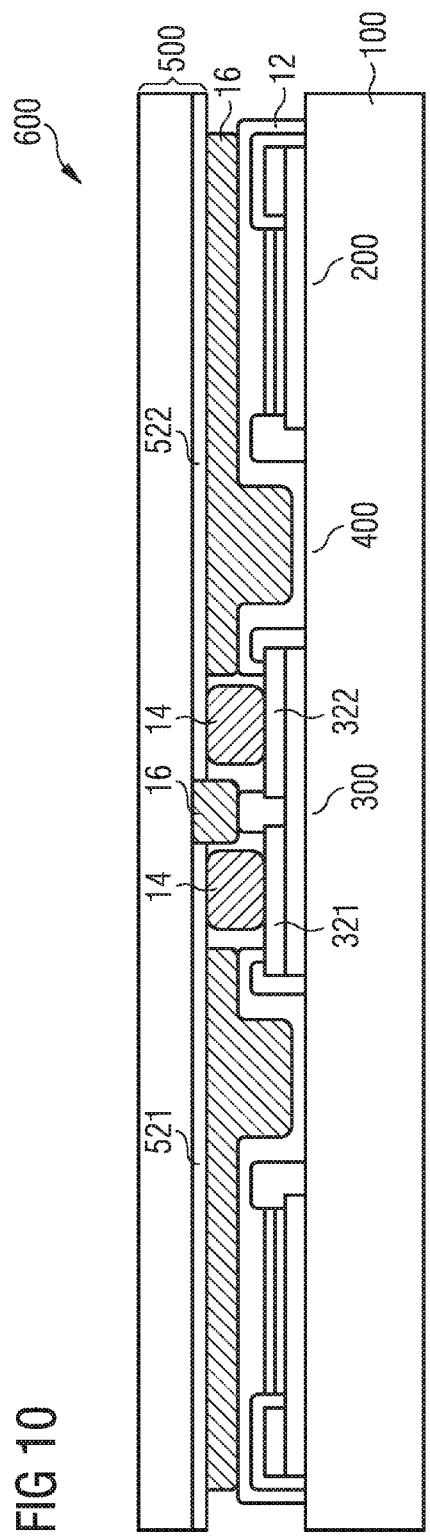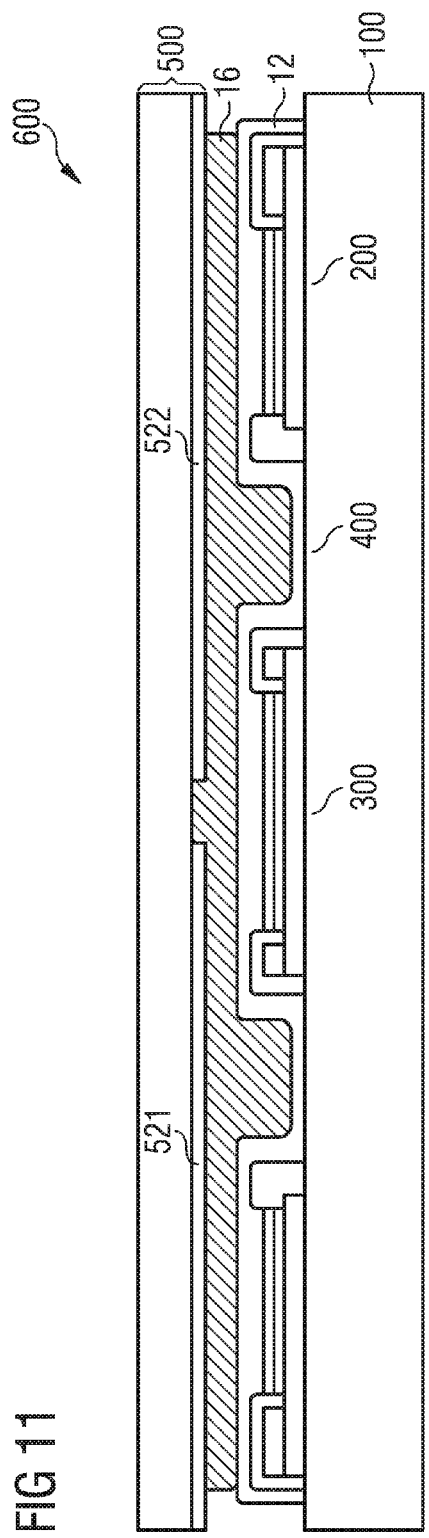

RADIATION-EMITTING APPARATUS HAVING AN OUTER OPTOELECTRONIC DEVICE SURROUNDING AN INNER OPTOELECTRONIC DEVICE AND METHODS FOR PRODUCING THE SAME

A radiation-emitting apparatus and a method for producing same are described.

This patent application claims the priority of German patent application 102014112879.6, the disclosure content of which is hereby incorporated by reference.

Radiation-emitting apparatuses and in particular those that comprise organic light-emitting diodes (OLEDs) are suitable as large-area, thin lighting elements. In many applications, it is desirable for electromagnetic radiation to be emitted over two lighting surfaces, one lighting surface laterally surrounding the other. In particular, it may be desirable for the intermediate region between the two lighting surfaces to be transparent.

One solution known from the prior art consists of contacting the inner light-emitting element over the intermediate region on the plane of the light-emitting element. A disadvantage of this solution is that the connecting structures necessary for this are generally not transparent and produce a visually disruptive effect in the intermediate region between the lighting surfaces.

At least one object of particular embodiments is to provide a radiation-emitting apparatus which has an inner lighting surface and an outer lighting surface surrounding the inner lighting surface and which does not require visually disruptive elements in the region between the two lighting surfaces.

This object is achieved by a radiation-emitting apparatus according to claim 1 and by a method according to claim 12.

Advantageous embodiments and developments of the article and of the method are characterized in the dependent claims and are also apparent from the following description and the drawings.

According to at least one embodiment of the radiation-emitting apparatus, a radiation-emitting apparatus comprises a substrate, at least one inner optoelectronic device arranged on the substrate and at least one outer optoelectronic device arranged on the substrate.

The fact that a layer or an element is arranged or applied "on" or "over" another layer or another element or even "between" two other layers or elements may mean here and hereinafter that the one layer or the one element is arranged directly in direct mechanical and/or electrical contact on the other layer or the other element. It may moreover also mean that the one layer or the one element is arranged indirectly on or over the other layer or the other element. In this case, further layers and/or elements may then be arranged between the one layer and the other layer or the one element and the other element.

According to at least one embodiment of the radiation-emitting apparatus, the outer optoelectronic device at least partially laterally surrounds the inner optoelectronic device.

A lateral direction is understood in particular to mean a direction in parallel with a main extension plane of the substrate and/or at least one of the light-emitting layers of the radiation-emitting apparatus. Similarly, a vertical direction is understood in particular to be a direction perpendicular to a main extension plane of the substrate and/or one of the light-emitting layers.

Each of the optoelectronic devices comprises a layer sequence that is suitable for generating electromagnetic radiation having at least one first electrode surface, at least one second electrode surface and at least one functional layer between the first electrode surface and the second electrode surface. The functional layer is suitable for generating electromagnetic radiation in a switched-on operating state.

According to at least one embodiment, the radiation-emitting apparatus comprises a cover element that is arranged on the optoelectronic devices. Therefore, the optoelectronic devices are arranged between the substrate and the cover element, wherein the substrate and/or the cover element can be formed so as to protect the optoelectronic devices from moisture and/or oxygen. The cover element comprises for example a cover support that preferably consists of glass or a polymer or contains one of these materials. Furthermore, an additional thin-layer encapsulation layer can be provided between the optoelectronic devices and the cover element.

According to at least one embodiment, the cover element comprises at least one first contact element that is connected (directly or indirectly) to the first electrode surface of the inner optoelectronic device in an electrically conductive manner, and at least one second contact element that is connected (directly or indirectly) to the second electrode surface of the inner optoelectronic device in an electrically conductive manner.

By virtue of the fact that the cover element comprises contact elements, by means of which the electrode surfaces of the inner optoelectronic device are contacted, it is not necessary to provide visually disruptive connecting structures on the plane of the optoelectronic devices in an intermediate region between the outer and inner optoelectronic devices. Rather, the inner optoelectronic device is contacted over the plane of the cover element. The typically translucent, in particular transparent, contact elements ensure that the intermediate region between the outer and inner optoelectronic devices can also be on the whole translucent, in particular transparent.

"Translucent" means here and hereinafter a layer which is permeable for visible light. The translucent layer can be transparent, i.e. clear-diaphanous, or can be at least partially light-scattering and/or partially light-absorbing, and so the translucent layer can also be, for example, diffuse- or milky-diaphanous. In a particularly preferred manner, a layer referred to here as translucent is as transparent as possible so that in particular the absorption of light is as low as possible.

According to at least one embodiment of the radiation-emitting apparatus, provision is made that the layer sequence of each of the optoelectronic devices comprises an organic functional layer, in particular an organic electroluminescent layer. The optoelectronic devices are thus formed as OLEDs.

The functional layers can comprise in particular an organic functional layer stack having an organic electroluminescent layer. The organic functional layer stack can comprise e.g. a hole injection layer, a hole transport layer, an electron blocking layer, a hole blocking layer, an electron transport layer and/or an electron injection layer that are suitable for conducting holes or electrons to the organic electroluminescent layer or for blocking the respective transport. Suitable layer structures for the organic functional layer stack are known to the person skilled in the art and therefore are not explained any further at this point.

According to at least one embodiment of the radiation-emitting apparatus, provision is made that a length and/or width of the inner optoelectronic device is between 1 cm and 10 cm, preferably between 2 cm and 5 cm.

According to at least one embodiment of the radiation-emitting apparatus, provision is made that a length and/or width of the outer optoelectronic device is between 2 cm and 30 cm, preferably between 5 cm and 20 cm.

According to at least one embodiment of the radiation-emitting apparatus, provision is made that the first and/or second electrode surface(s) of the inner and/or outer optoelectronic device is(are) translucent, in particular transparent. Preferably, the electrode surface(s) of the inner and/or outer optoelectronic device that is(are) arranged between the functional layers and the substrate is(are) transparent, and so light emitted from the functional layers can be radiated through the electrode surfaces and the substrate.

The transparent electrode surfaces preferably comprise a transparent conductive oxide (TCO). Transparent conductive oxides are transparent, conductive materials, generally metal oxides, such as for example zinc oxide, tin oxide, cadmium oxide, titanium oxide, indium oxide or indium-tin oxide (ITO).

The electrode surface(s) of the inner and/or outer optoelectronic device that is(are) arranged between the functional layers and the cover element can likewise be transparent, and so light emitted from the functional layers can be radiated through the electrode surfaces and the cover element. Alternatively, the electrode surface(s) of the inner and/or outer optoelectronic device that is(are) arranged between the functional layers and the cover element can be reflective.

According to at least one embodiment of the radiation-emitting apparatus, provision is made that the substrate is translucent, in particular transparent. In this case, a radiation exit surface of the radiation-emitting apparatus can be formed by the substrate. Preferably, the substrate consists of glass or a polymer or contains one of these materials.

According to at least one embodiment of the radiation-emitting apparatus, provision is made that the cover element is translucent, in particular transparent. In this case, a radiation exit surface of the radiation-emitting apparatus can be formed by the cover element. Preferably, the cover element comprises a cover support that consists of glass or a polymer or contains one of these materials and on which the translucent contact elements are arranged.

According to at least one embodiment of the radiation-emitting apparatus, provision is made that the contact elements comprise a transparent conductive oxide, e.g. indium tin oxide, or consist of a transparent conductive oxide, e.g. indium tin oxide. Preferably, each of the contact elements extends in each case as far as a lateral edge of the radiation-emitting apparatus.

According to at least one embodiment of the radiation-emitting apparatus, provision is made that an intermediate region between the inner optoelectronic device and the outer optoelectronic device is translucent, in particular transparent.

According to at least one embodiment of the radiation-emitting apparatus, provision is made that the contact elements are each connected to contact structures in an electrically conductive manner, which contact structures are arranged at an edge of the inner optoelectronic device and are connected to the electrode surfaces of the inner optoelectronic device in an electrically conductive manner.

According to at least one embodiment of the radiation-emitting apparatus, provision is made that the contact elements are attached to the contact structures via a conductive adhesive.

According to at least one embodiment of the radiation-emitting apparatus, the contact elements are connected to the contact structures via recesses in a thin-film encapsulation layer that is arranged at least over the layer sequence of the inner optoelectronic device. This protects the layer sequence of the inner optoelectronic device against moisture and oxygen in the air. The thin-film encapsulation layer can also cover the layer sequence of the outer optoelectronic device and extend e.g. as a continuous layer over the two optoelectronic devices and the intermediate region formed therebetween.

According to at least one embodiment of the radiation-emitting apparatus, provision is made that the outer optoelectronic device completely laterally surrounds the inner optoelectronic device. For example, the outer optoelectronic device can be arranged annularly around the inner optoelectronic device. An annular arrangement is understood to mean both a circular arrangement and also an arrangement having a more general annular shape, e.g. in rectangles or squares, the optoelectronic devices being arranged around the center points thereof. Preferably, the outer optoelectronic device and the inner optoelectronic device are arranged concentrically with respect to each other.

According to at least one embodiment of the radiation-emitting apparatus, provision is made that the contact elements are in the form of strips.

According to at least one embodiment of the radiation-emitting apparatus, provision is made that the cover element protrudes beyond the substrate in the preferential direction. In the region not covered by the substrate, the contact elements of the cover element can be easily contacted from the outside. Preferably, the region of the cover element not covered by the substrate forms a contacting strip that, for example, can be inserted into a corresponding separate fitting, by way of which the inner optoelectronic device can be supplied with electrical energy. The outer optoelectronic device can be contacted for example via a further contacting strip that is spatially spaced apart. The contacting strips are preferably formed by severing the manufacturing substrate comprising a multiplicity of radiation-emitting apparatuses produced next to each other, e.g. by scoring and breaking along suitable lines.

A further aspect of the invention relates to a method for producing a radiation-emitting apparatus that is formed as described above.

According to at least one embodiment, the method comprises the following method steps:

providing a substrate and at least two optoelectronic devices arranged on the substrate, wherein an outer optoelectronic device at least partially laterally surrounds at least one inner optoelectronic device;

providing a cover element, wherein the cover element comprises a cover support and at least one first and one second contact element on a major surface of the cover support; and attaching the cover element to the optoelectronic devices, wherein the first contact element is connected to the first electrode surface of the inner optoelectronic device in an electrically conductive manner and the second contact element is connected to the second electrode surface of the inner optoelectronic device in an electrically conductive manner. For example, the cover element can be adhered to the optoelectronic devices.

According to at least one embodiment of the method, the contact elements are attached to contact structures via a conductive adhesive, which contact structures are arranged at an edge of the inner optoelectronic device and are connected to the electrode surfaces of the inner optoelectronic device in an electrically conductive manner. Preferably, the contact structures are at least partially exposed by using laser ablation. The diameter of the laser beam used for this purpose is preferably between 25 μm and 100 μm, in a particularly preferred manner 60 μm or less. The laser can be a diode-pumped solid-state laser. The laser can generate laser radiation in the UV range, e.g. at a wavelength of 370 nm. The power of the laser can be e.g. between 1 W and 4 W.

According to at least one embodiment of the method, the contact elements are structured by using laser ablation. Preferably, the contact elements of the cover element are produced by laser-structuring a layer consisting of a transparent conductive oxide on one of the major surfaces of the cover support.

Further advantages, advantageous embodiments and developments are apparent from the exemplified embodiments described below in conjunction with the figures.

IN THE DRAWING

FIGS. 1 to 9 show a method for producing a radiation-emitting apparatus in accordance with the invention according to a first exemplified embodiment, and FIGS. 10 and 11 show schematic sectional views of the radiation-emitting apparatus.

In the exemplified embodiments and figures, like or similar elements or elements acting in an identical manner may each be provided with the same reference numerals. The illustrated elements and their size ratios with respect to each other are not to be considered as being to scale; rather, individual elements, such as e.g. layers, components, devices and regions, can be illustrated excessively large for improved clarity and/or for improved understanding; this can relate to individual dimensions or to all dimensions of the elements.

FIGS. 1 to 9 show a method for producing a radiation-emitting apparatus in accordance with the invention according to a first exemplified embodiment.

In a first method step illustrated in FIG. 1, a substrate 100 is provided that consists, for example, of glass and on which two optoelectronic devices 200, 300 in the form of organic light-emitting diodes are arranged. An outer optoelectronic device 200 has a rectangular shape with a central recess in which an inner optoelectronic device 300 is arranged that is completely surrounded by the outer optoelectronic device 200 in a lateral direction and that likewise has a rectangular shape. The center points of the two optoelectronic devices 200, 300 coincide with each other. An intermediate region 400 between the two optoelectronic devices 200, 300 is transparent and free of a layer sequence that is suitable for generating radiation.

Figure 2:
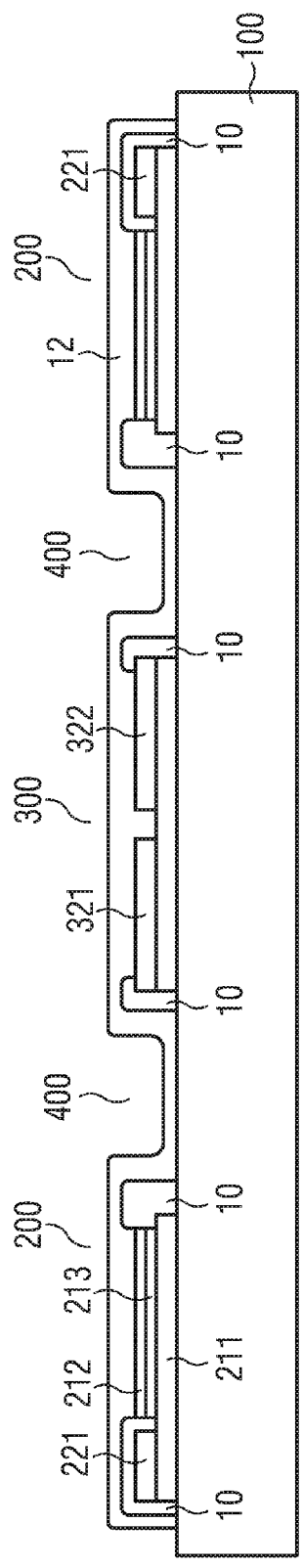
Figure 3:
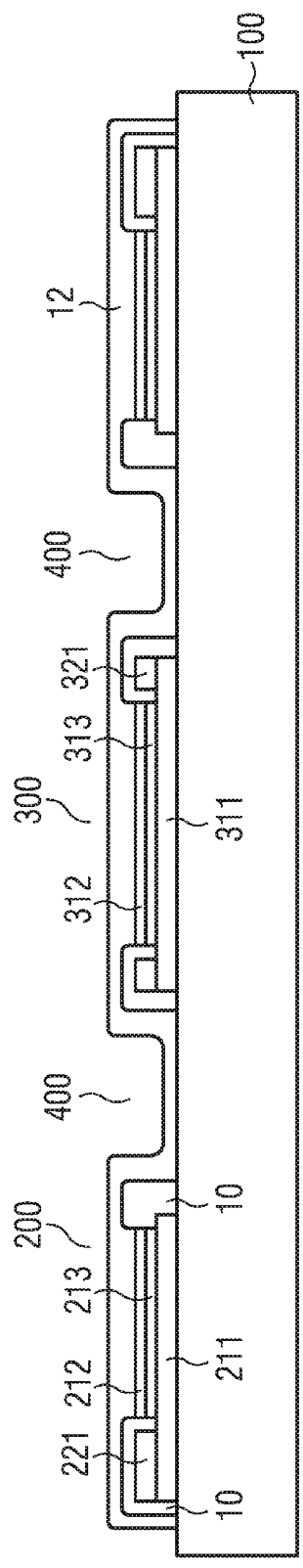

FIGS. 2 and 3 show schematic sectional views of the structure shown in FIG. 1, wherein the section in FIG. 2 is taken along line A-A in FIG. 1 and the section in FIG. 3 is taken along line B-B in FIG. 1.

As illustrated in FIGS. 2 and 3, the outer optoelectronic device 200 comprises a transparent anode 211, that in the present exemplified embodiment consists of indium tin oxide, a transparent cathode 212, that in the present exemplified embodiment consists of a thin silver layer, and an organic functional layer 213 arranged therebetween. The outer optoelectronic device 200 comprises, at its edge, outer contact structures 221, 222 consisting of metal that are connected to the anode 211 or cathode 212 in an electrically conductive manner.

Similarly, the inner optoelectronic device 300 comprises a transparent anode 311, that in the present exemplified embodiment consists of indium tin oxide, a transparent cathode 312, that in the present exemplified embodiment consists of a thin silver layer, and an organic functional layer 313 arranged therebetween. The inner optoelectronic device 300 comprises, at its edge, inner contact structures 321, 322 consisting of metal that are connected to the anode 311 or cathode 312 in an electrically conductive manner.

Furthermore, FIGS. 2 and 3 illustrate resistance elements 10 that insulate layers, that are not electrically connected, from one another. A continuous thin-film encapsulation layer 12, that protects the layer sequence of the two optoelectronic devices 200, 300 against moisture and oxygen in the air, extends over the layer sequence of the two optoelectronic devices 200, 300 and over the intermediate region 400.

In the method steps illustrated in FIGS. 4 and 5, the thin-film encapsulation layer 12 is removed in regions 331, 332 of the inner contact structures 321, 322 by using laser ablation and the inner contact structures 321, 322 are exposed thereby at least in regions. FIG. 6 shows the exposed regions 331, 332 in a plan view of the optoelectronic devices 200, 300.

In a further method step, a cover element 500 is provided with a cover support 510 and a first and a second strip-like contact element 521, 522 (FIG. 7). The two contact elements 521, 522 are formed by laser-structuring a layer consisting of a transparent conductive oxide, in particular indium tin oxide, on one of the major surfaces of the cover support 510. More precisely, the layer is partitioned by a laser along a straight line 523, and therefore the contact elements 521, 522 are electrically separated from each other.

As shown in FIG. 8, an adhesive 16 (not electrically conductive) is subsequently applied over a large area on the two contact elements 521, 522 (e.g. by screen printing) with the exception of two regions 531, 532 in which contacting of the inner contact structures is to take place. A conductive adhesive 14 is applied in these regions. Alternatively, the conductive adhesive can also be applied in the exposed regions 331, 332 on the inner contact structures 321, 322.

Figure 9:
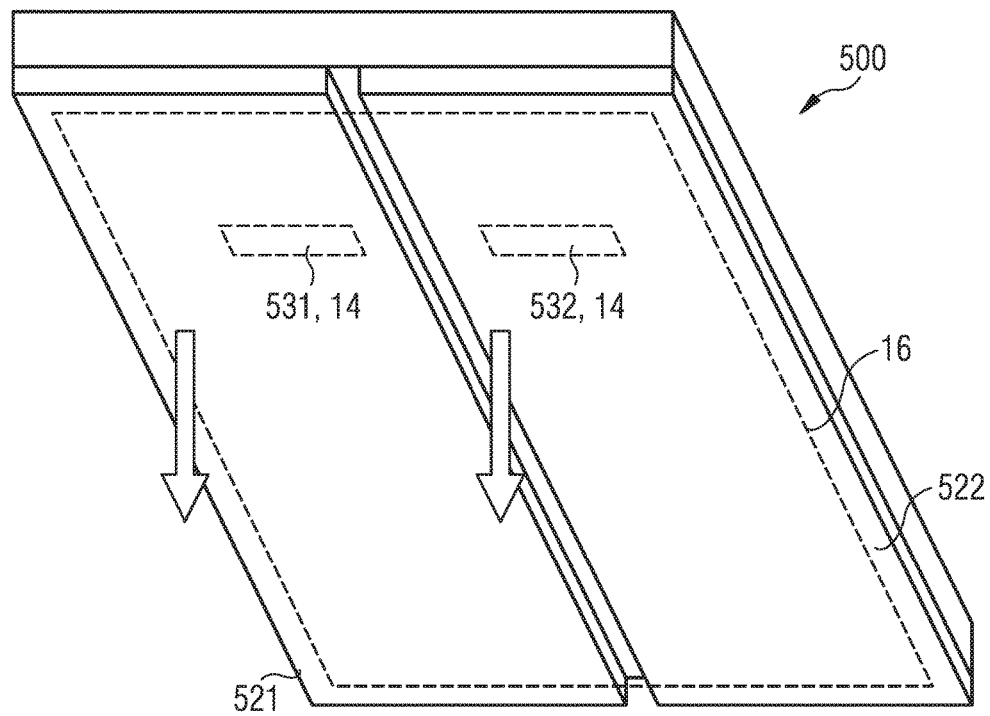

In a further method step illustrated in FIG. 9, the cover element 500 is adhered, e.g. laminated, using an adhesive 16 to the glass substrate 100 with the optoelectronic devices 200, 300 arranged thereon, and therefore the contact elements 521, 522, in the two regions 331, 332 in which the inner contact structures 321, 322 are exposed, are attached thereto and electrically connected thereto via the conductive adhesive 14. The structure produced hereby is subsequently cured.

FIGS. 10 and 11 show the finished radiation-emitting apparatus 600 in accordance with the invention and according to the first exemplified embodiment in schematic sectional views corresponding to the sectional planes shown in FIGS. 2 and 3.

The description made with reference to the exemplified embodiments does not restrict the invention to these embodiments. Rather, the invention encompasses any new feature and any combination of features, including in particular any combination of features in the claims, even if this feature or this combination is not itself explicitly indicated in the claims or exemplified embodiments.

The invention claimed is:

1. Radiation-emitting apparatus, comprising
   a substrate,
   an inner optoelectronic device and an outer optoelectronic device which at least partially laterally surrounds the inner optoelectronic device, wherein each of the optoelectronic devices comprises a layer sequence that is suitable for generating electromagnetic radiation having at least one first electrode surface, at least one second electrode surface and at least one functional layer between the first electrode surface and the second electrode surface, wherein the functional layer is suitable for generating electromagnetic radiation in a switched-on operating state, and a cover element that is arranged on the optoelectronic devices and comprises at least one first contact element, that is connected to the first electrode surface of the inner optoelectronic device in an electrically conductive manner, and at least one second contact element that is connected to the second electrode surface of the inner optoelectronic device in an electrically conductive manner.

2. Radiation-emitting apparatus according to claim 1, wherein the substrate and/or the cover element is translucent.

3. Radiation-emitting apparatus according to claim 1, wherein the contact elements comprise a transparent conductive oxide or consist of a transparent conductive oxide.

4. Radiation-emitting apparatus according to claim 1, wherein each of the contact elements extends in each case as far as an edge of the radiation-emitting apparatus.

5. Radiation-emitting apparatus according to claim 1, wherein an intermediate region between the inner optoelectronic device and the outer optoelectronic device is translucent.

6. Radiation-emitting apparatus according to claim 1, further comprising contact structures arranged at an edge of the inner optoelectronic device and connected to the electrode surfaces of the inner optoelectronic device in an electrically conductive manner, wherein the contact elements are each connected to the contact structures in an electrically conductive manner.

7. Radiation-emitting apparatus according to claim 6, wherein the contact elements are attached to the contact structures via a conductive adhesive.

8. Radiation-emitting apparatus according to claim 6, wherein the contact elements are connected to the contact structures via recesses in a thin-film encapsulation layer that is arranged at least over the layer sequence of the inner optoelectronic device.

9. Radiation-emitting apparatus according to claim 1, wherein the outer optoelectronic device completely laterally surrounds the inner optoelectronic device.

10. Radiation-emitting apparatus according to claim 1, wherein the outer optoelectronic device and the inner optoelectronic device are arranged concentrically with respect to each other.

11. Radiation-emitting apparatus according to claim 1, wherein the contact elements are in the form of strips.

12. Radiation-emitting apparatus, comprising a substrate, an inner optoelectronic device and an outer optoelectronic device which at least partially laterally surrounds the inner optoelectronic device, wherein each of the optoelectronic devices comprises a layer sequence that is suitable for generating electromagnetic radiation having at least one first electrode surface, at least one second electrode surface and at least one functional layer between the first electrode surface and the second electrode surface, wherein the functional layer is suitable for generating electromagnetic radiation in a switched-on operating state, and a cover element that is arranged on the optoelectronic devices and comprises at least one first contact element, that is connected to the first electrode surface of the inner optoelectronic device in an electrically conductive manner, and at least one second contact element that is connected to the second electrode surface of the inner optoelectronic device in an electrically conductive manner, wherein each of the contact elements extends in each case as far as an edge of the radiation-emitting apparatus.

13. Radiation-emitting apparatus according to claim 12, wherein the contact elements are each connected to contact structures in an electrically conductive manner, which contact structures are arranged at an edge of the inner optoelectronic device and are connected to the electrode surfaces of the inner optoelectronic device in an electrically conductive manner.

14. Radiation-emitting apparatus according to claim 13, wherein the contact elements are connected to the contact structures via recesses in a thin-film encapsulation layer that is arranged at least over the layer sequence of the inner optoelectronic device.

15. Method for producing a radiation-emitting apparatus, comprising the following method steps:

providing a substrate and an inner optoelectronic device and an outer optoelectronic device arranged on the substrate, wherein the outer optoelectronic device at least partially laterally surrounds the inner optoelectronic device;

providing a cover element, wherein the cover element comprises a cover support and at least one first and one second contact element on a major surface of the cover support; and attaching the cover element to the optoelectronic devices, wherein the first contact element is connected to the first electrode surface of the inner optoelectronic device in an electrically conductive manner and the second contact element is connected to the second electrode surface of the inner optoelectronic device in an electrically conductive manner.

16. Method according to claim 15, further providing contact structures arranged at an edge of the inner optoelectronic device and connected to the electrode surfaces of the inner optoelectronic device in an electrically conductive manner, wherein the contact elements are attached to the contact structures via a conductive adhesive.

17. Method according to claim 16, wherein the contact structures are exposed by using laser ablation.

18. Method according to claim 15, wherein the contact elements are structured by using laser ablation.

* * * * *